United States Patent
Hutchison, IV et al.

(10) Patent No.: US 6,262,913 B1
(45) Date of Patent: Jul. 17, 2001

(54) METHOD AND APPARATUS FOR IMPROVING CELL LIFE OF SEQUENTIAL COUNTERS STORED IN NON-VOLATILE MEMORY

(75) Inventors: James A. Hutchison, IV; Lee Spall, both of San Diego, CA (US)

(73) Assignee: Qualcomm Incorporated, San Diego, CA (US)

( * ) Notice: Subject to any disclaimer, the term of this patent is extended or adjusted under 35 U.S.C. 154(b) by 0 days.

(21) Appl. No.: 09/420,890

(22) Filed: Oct. 19, 1999

(51) Int. Cl.[7] .................................................. G11C 11/34
(52) U.S. Cl. ............................. 365/185.09; 365/185.03
(58) Field of Search .......................... 365/185.09, 185.03

(56) References Cited

U.S. PATENT DOCUMENTS

| | | | |
|---|---|---|---|
| 4,512,029 | 4/1985 | Brice | 377/33 |
| 4,584,647 | 4/1986 | Eckert | 364/464 |
| 5,088,061 | 2/1992 | Golnabi, et al. | 365/189.01 |
| 5,974,485 | 10/1999 | Kruschinski | 710/52 |
| 6,038,165 | * 3/2000 | Miwa et al. | 365/185.03 |

FOREIGN PATENT DOCUMENTS 0854425   11/1997   (EP) ............................. G06F/11/20

* cited by examiner

*Primary Examiner*—David Nelms
*Assistant Examiner*—M. Tran
(74) *Attorney, Agent, or Firm*—Philip R. Wadsworth; Charles D. Brown; Tom Streeter

(57) ABSTRACT

A method and apparatus for updating and storing a counter value. In response to each of a plurality of N counter update signals, a binary memory cell is selected from a plurality of binary memory cells and the state of the selected binary memory cell is inverted. After the N counter update signals are received, a register that is separate from the plurality of binary memory cells is incremented, and the process is then repeated in response to further counter update signals. Each of the plurality of binary memory cells is inverted on average an equal number of times during each repetition of the process. The states of the plurality of binary memory cells and the value in the register represent the counter value at any given time.

10 Claims, 3 Drawing Sheets

| COUNTER UPDATE SIGNAL | ADDER BIT SEQUENCE |
|---|---|
| X | 000 |
| X + 1 | 001 |
| X + 2 | 011 |
| X + 3 | 010 |
| X + 4 | 110 |
| X + 5 | 111 |
| X + 6 | 101 |
| X + 7 | 100 |

← END-OF-CYCLE VALUE

WHERE X IS AN INTEGRAL MULTIPLE OF N = 8

METHOD AND APPARATUS FOR IMPROVING CELL LIFE OF SEQUENTIAL COUNTERS STORED IN NON-VOLATILE MEMORY

BACKGROUND OF THE INVENTION

I. Field of the Invention

The present invention relates generally to electronic counters. More particularly, the present invention relates to electronic counters that are implemented using memory devices or cells that wear out after extended use. Even more particularly, the present invention relates to a novel electronic counter that prolongs the useful life of memory cells used for implementing the counter.

II. Description of the Related Art

Non-volatile memory devices, such as EEPROMs, have memory cells that wear out. When cells in such non-volatile memory devices are used for implementing a typical counter that is written to continuously, the memory cells representing the least significant bits of the counter will be written to most often and will often wear out quickly as result of such use. As the memory cells wear out, new storage locations must be allocated to hold the counter. Since in many electronic devices the amount of available non-volatile memory cells is limited, allocation of additional memory cells to a counter in order to compensate for worn-out cells is undesirable. In view of this, it would be advantageous to provide a counter that could be implemented in non-volatile memory and that minimized the wear on the memory cells used for the counter.

SUMMARY OF THE INVENTION

The present invention is directed to a method and apparatus for updating and storing a counter value. In response to each of a plurality of N counter update signals, a binary memory cell is selected from a plurality of binary memory cells and the state of the selected binary memory cell is inverted. After the N counter update signals are received, a register that is separate from the plurality of binary memory cells is incremented, and the process is then repeated in response to further counter update signals. Each of the plurality of binary memory cells is inverted on average an equal number of times during each repetition of the process. The states of the plurality of binary memory cells and the value in the register represent the counter value at any given time.

In accordance with a preferred embodiment, a conversion table is used to facilitate the determination of the counter value at any given time. In this embodiment, an index value is determined by applying the states of the plurality of binary memory cells to a conversion table. The counter value is then determined by summing the index value and a cycle count value. The counter value can also be determined by summing the index value, the cycle count value and an offset value.

In accordance with a further aspect, the present invention can be used to extend the life of a counter in cases when one or more individual memory cells in the counter become inoperative. In this embodiment, after one of the plurality of binary memory cells is identified as being inoperative, the conversion table is modified in response to the inoperative binary memory cell, and the inoperative binary memory cell is removed from the plurality of binary memory cells that may selected during subsequent repetitions of the process.

BRIEF DESCRIPTION OF THE DRAWINGS

The features, objects and advantages of the present invention will become more apparent from the detailed description set forth below when taken in conjunction with the drawings in which like reference characters identify corresponding elements and wherein.

DETAILED DESCRIPTION OF THE PREFERRED EMBODIMENTS

Figures 1, 2:
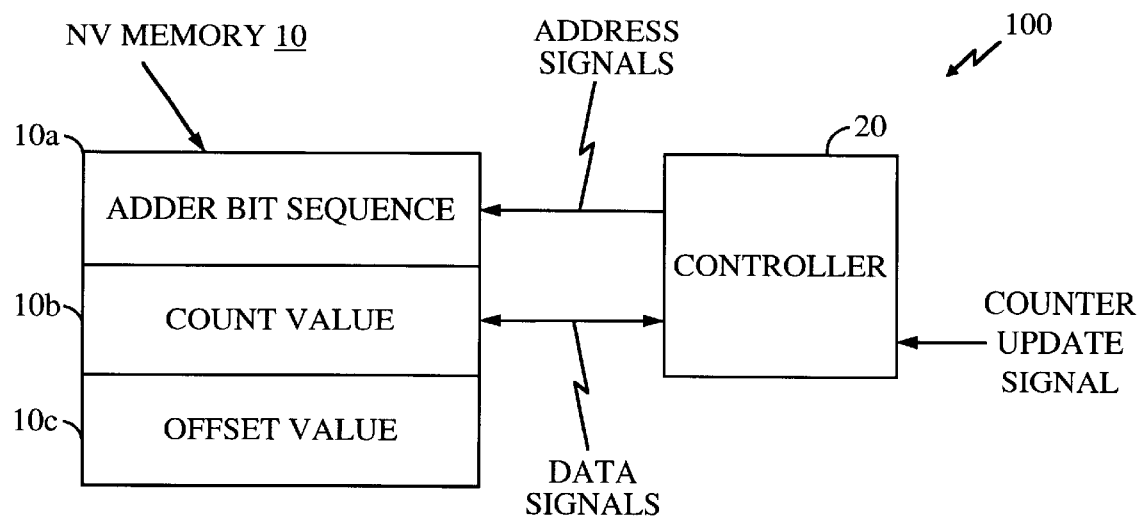
FIG. 1 is a block diagram of a counter that improves cell life, in accordance with a preferred embodiment of the present invention.
FIG. 2 is a table showing a cycle in which the ADDER Bits of the present invention are inverted in response to a series of counter update pulses, in accordance with an example of the present invention.

Referring now to FIG. 1, there is a block diagram of a counter 100 that improves cell life, in accordance with a preferred embodiment of the present invention. The counter includes a non-volatile memory 10 that includes a plurality of binary memory cells (e.g., bits) in memory portion 10a that correspond to an ADDER Bit Sequence, a second portion 10b that corresponds to a conventional register or binary counter that is used for storing a COUNT value, and a third portion 10c that corresponds to a conventional register that is used for storing an OFFSET value. The portions 10a, 10b, 10c of the non-volatile memory are accessed using address signals provided from a controller 20. As explained more fully below, the controller 20 selectively updates the ADDER Bit Sequence, COUNT value, and an OFFSET value, stored in a typical counter.

By way of example, the counter 100 may function as follows. The controller 20 initializes the counter to a starting value by setting the OFFSET value to the starting value, by setting the register used for the COUNT value to zero, and by setting all the bits in the ADDER Bit Sequence to zero. Next, in response to each of a plurality of N counter update signals, the controller 20 selects a binary memory cell from the ADDER Bit Sequence and inverts the state of the selected binary memory cell. After the controller 20 receives N counter update signals, the controller 20 increments the register used for storing the COUNT value, and the process is then repeated in response to further counter update signals. Significantly, and as explained more fully below, each of the binary memory cells used for implementing the ADDER Bit Sequence is inverted on average an equal number of times during each repetition of the process, thereby distributing the wear among all bits used for implementing the ADDER Bit Sequence. The states of the ADDER Bit Sequence, and the registers holding the COUNT and OFFSET values represent the value stored in counter 100 at any given time.

The sequence of binary memory cells used for implementing the ADDER Bit Sequence is most efficient at reducing wear on the cells if each successive write to the ADDER Bit Sequence (e.g., each time a bit in the sequence is inverted) functions to age the cell be written to in a fashion which distributes the wear across all the memory cells being used to implement the ADDER Bit Sequence. For non-volatile memory devices which are block erased and age as each bit is changed from the erased value, the ADDER Bit Sequence is most efficiently represented as a sequence of erased bits where one bit in the sequence is inverted each time counter 100 is increment. It is not critical that the bits be changed in any particular order. If any bits in the ADDER Bit Sequence get stuck in either the erased or written state, due to aging or other failure, this can be taken into account by reducing the range of ADDER Bit Sequence by the each stuck bit. As controller 20 removes each stuck (or worn) bit from the ADDER BIT Sequence, controller 20 then increments the ADDER Bit Sequence in response to each further counter update signal using only the remaining bits in the ADDER Bit Sequence.

For non-volatile memory devices that age each time a datum (e.g., a memory bit) is modified, the ADDER Bit Sequence is best represented by a sequence where one datum changes state (e.g., is inverted) with each increment of the counter 100. The sequence in which states of the datum are changed should be cyclic so that incrementing from the least ADDER Bit Sequence value to the greatest ADDER Bit Sequence value does not result in any additional aging to any particular datum. Rather, the sequence in which the datum are inverted distributes the wear across all datum used for representing the ADDER Bit Sequence. There are many bit inverting cycles which meet this criteria, and the entire set of sequences can be discovered by searching a binary tree of depth N where each node represents a one datum change from the previous node.

Referring now to FIG. 2, there is a table showing an exemplary cycle in which the ADDER Bits of the present invention are inverted in response to a series of counter update pulses received by controller 20, in accordance with an example of the present invention. In the example shown in FIG. 2, the ADDER Bit Sequence is three bits in length, and the length of the cycle in which states of the datum in the sequence are changed is eight (N=8). Thus, in the example of FIG. 2, the states of the bits in the ADDER Bit Sequence will repeat after every eight counter update signals. The state of the bits in the ADDER Bit Sequence after receipt of the last counter update signal in the cycle represent an END_OF_CYCLE value that is used (as explained more fully below) to indicate that the COUNT value should be incremented in response to the next counter update signal.

It will be understood by those skilled in the art that ADDER Bit Sequences that are longer than three bits in length can used for implementing the ADDER Bit Sequence of the present invention. It will also be understood by those skilled in the art that memory cells other than binary memory cells (i.e., memory cells that can take on more than two states) can be used for implementing the ADDER Bit Sequence. The selection of the length of the ADDER Bit Sequence and the number of states each datum in the sequence can assume are a matter of design choice. What is significant for purposes of the present invention is that wear be distributed evenly across all memory cells used for the ADDER Bit Sequence in response to each cycle of counter update signals.

Figure 3:
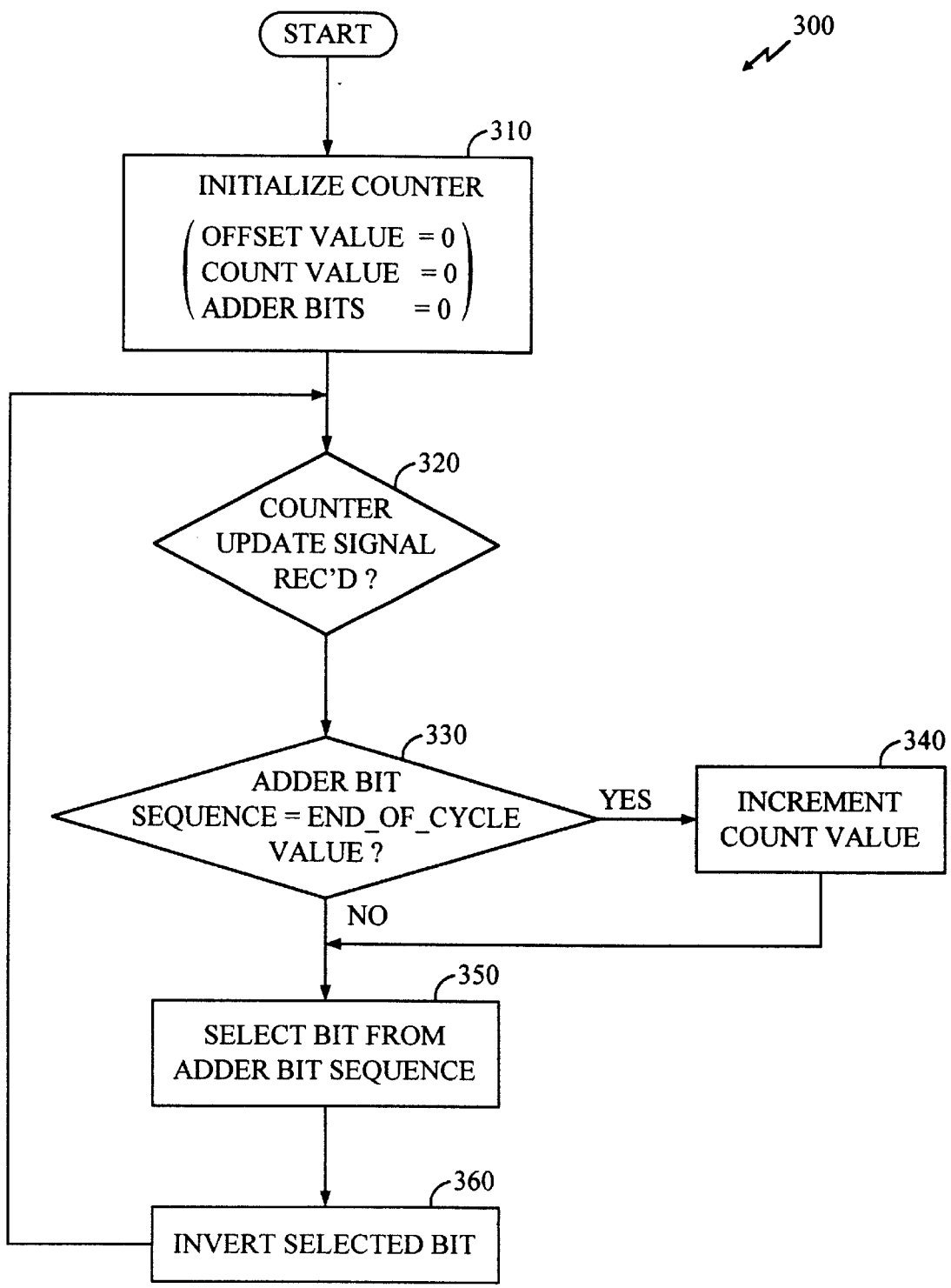
FIG. 3 is a flow diagram showing a method for incrementing the counter shown in FIG. 1, in accordance with a preferred embodiment of the present invention.

Referring now to FIG. 3, there is a flow diagram showing a method 300 for incrementing the counter shown in FIG. 1, in accordance with a preferred embodiment of the present invention. Method 300 is preferably implemented in software on controller 20. In step 310, the controller 20 initializes the counter 100 to a starting value by setting the OFFSET value to the starting value, by setting the register used for the COUNT value to zero, and by setting all the bits in the ADDER Bit Sequence to zero. Where the starting value of counter 100 is zero (as shown in FIG. 3), the OFFSET value will be set to zero. However, it will be understood by those skilled in the art that the starting value of counter 100 may be set to any arbitrary value by placing a corresponding value in the register used for storing the OFFSET value in step 310. Next, following receipt of a counter update signal (step 320), the state of the bits in the ADDER Bit Sequence is compared in step 330 to the END_OF_CYCLE value. If the bits in the ADDER Bit Sequence are the same as the END_OF_CYCLE value, then in step 340 the COUNT value is incremented. Since the COUNT value is preferably stored in a conventional register, this value is incremented in a standard manner. In steps 350 and 360, a bit from the ADDER Bit Sequence is selected and inverted in accordance with a cycle (such as that described above and shown in FIG. 2) in which each of the memory cells used for implementing the ADDER Bit Sequence is inverted on average an equal number of times during each repetition of the cycle.

Figure 4:
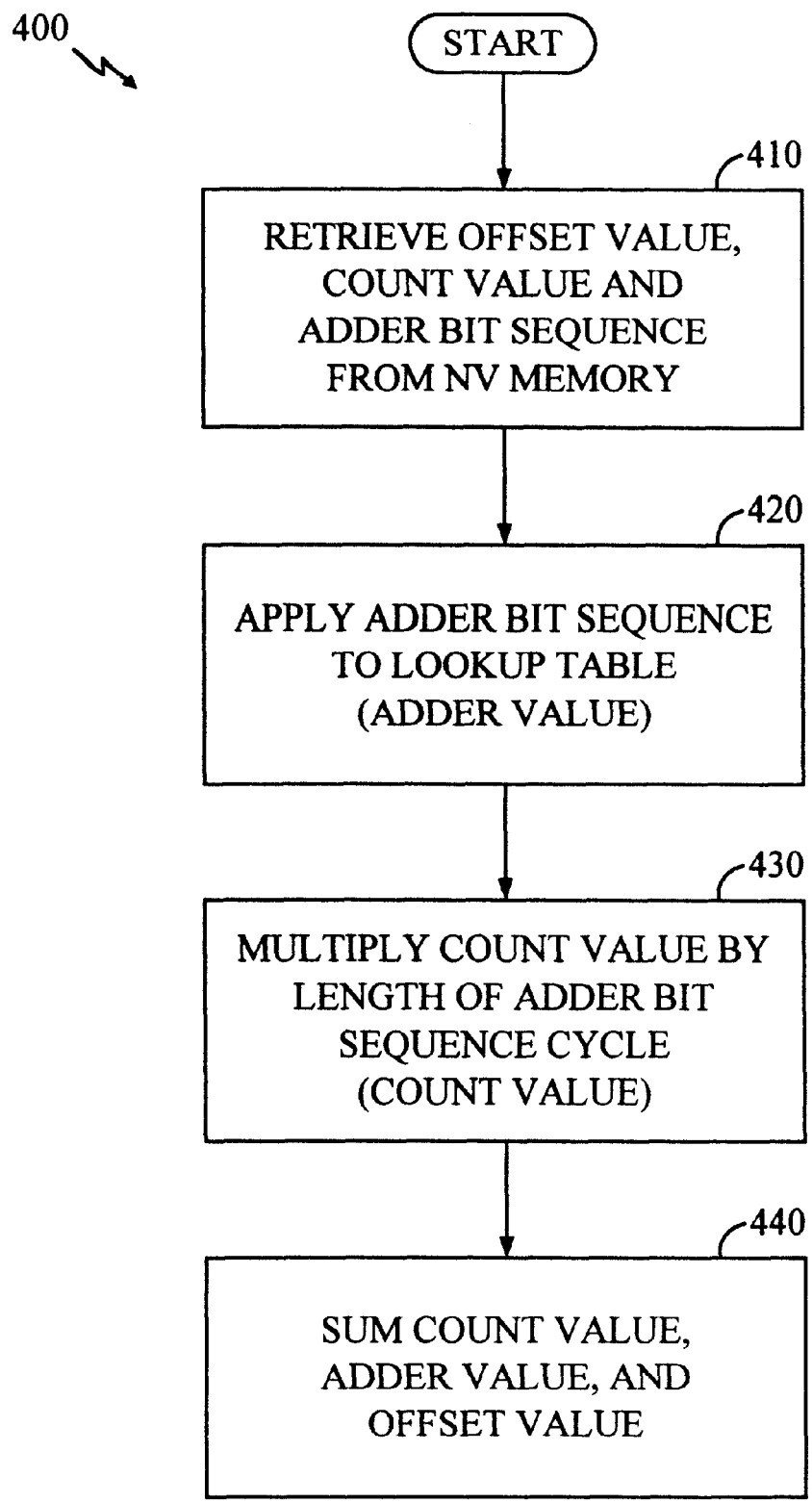
FIG. 4 is a flow diagram showing a method for retrieving a counter value from the counter shown in FIG. 1.

The states of the ADDER Bit Sequence, and the registers holding the COUNT and OFFSET values represent the value stored in counter 100 at any given time, and this information is used by controller 20 to determine the value stored in counter 100 at any given time. Referring now to FIG. 4, there is a flow diagram of a method 400 for retrieving a counter value from the counter shown in FIG. 1. Method 400 is preferably implemented in software on controller 20. In step 410, controller 20 retrieves the OFFSET and COUNT values, and the ADDER Bit Sequence from memory 10. Next, in step 420, a numeric value is generated from all the bits in the ADDER Bit Sequence, and this numeric value is used to index a look up or conversion table which outputs a value (the ADDER VALUE) representative of the number of times the ADDER Bit Sequence was incremented since the last END_OF_CYCLE value was reached. In cases where one or more of the bits in the ADDER Bit Sequence have become stuck or worn, the conversion table is modified to account for the lost bits. Next, in step 430, the controller calculates a COUNT VALUE by multiplying the value stored in the COUNT register by the length of the cycle used for incrementing the ADDER Bit Sequence. In the example shown in FIG. 2, the length of this cycle was N=4. Finally, in step 440, the value stored in counter 100 is determined by summing the ADDER VALUE (from step 420), the COUNT VALUE (from step 430) and the OFFSET value retrieved from memory.

The previous description of the preferred embodiments is provided to enable any person skilled in the art to make or use the present invention. Various modifications to the embodiments described above will be readily apparent to those skilled in the art, and the generic principles defined herein may be applied to other embodiments without the use of inventive faculty. Thus, the present invention is not intended to be limited to the methods and apparatuses shown herein but is to be accorded the widest scope consistent with the claims set forth below.

What is claimed is:

1. A method for updating and storing a counter value, comprising the steps of:
    (A) in response to each of a plurality of N counter update signals, selecting a binary memory cell from a plurality of binary memory cells and inverting a state of the selected binary memory cell; and
    (B) after step (A), incrementing a register value and repeating step (A);
    wherein the counter value is represented at any given time by the states of the plurality of binary memory cells and the register value, and wherein each of the plurality of binary memory cells is inverted on average an equal number of times during each repetition of step (A).

2. A method for updating and storing a counter value, comprising the steps of:

(A) in response to each of a plurality of N counter update signals, selecting a binary memory cell from a plurality of binary memory cells and inverting a state of the selected binary memory cell; and (B) after step (A), incrementing a register value and repeating step (A);

wherein the counter value is represented at any given time by the states of the plurality of binary memory cells and the register value, and wherein each of the plurality of binary memory cells is inverted on average an equal number of times during each repetition of step (A);

(C) determining an index value by applying the states of the plurality of binary memory cells to a conversion table; and (D) determining the counter value by summing the index value and a cycle count.

3. The method of claim 2, further comprising the steps of:

(E) identifying one of the plurality of binary memory cells as being inoperative and modifying the conversion table in response to the binary memory cell identified as being inoperative;

(F) after step (E), removing the binary memory cell identified as being inoperative from the plurality of binary memory cells that may selected during subsequent repetitions of step (A).

4. The method of claim 2, wherein step (D) comprises determining the counter value by summing the index value, the cycle count and an offset value.

5. A method for updating and storing a counter value, comprising the steps of:

(A) in response to each of a plurality of N counter update signals, selecting a binary memory cell from a plurality of binary memory cells and inverting a state of the selected binary memory cell; and (B) after step (A), incrementing a register value and repeating step (A);

wherein the counter value is represented at any given time by the states of the plurality of binary memory cells and the register value, and wherein each of the plurality of binary memory cells is inverted on average an equal number of times during each repetition of step (A); and wherein the register incremented in step (B) corresponds to a standard binary counter.

6. An apparatus for updating and storing a counter value, comprising:

(A) a plurality of binary memory cells;

(B) a register that is different from the plurality of binary memory cells; and (C) a controller, coupled to the plurality of binary memory cells and the register, that selects a binary memory cell from the plurality of binary memory cells and inverts a state of the selected binary memory cell in response to each of a plurality of N counter update signals;

wherein the controller increments the register once every N counter update signals and wherein the controller on average inverts each of the plurality of binary memory cells an equal number of times.

7. An apparatus for updating and storing a counter value, comprising:

(A) a plurality of binary memory cells;

(B) a register that is different from the plurality of binary memory cells; and (C) a controller, coupled to the plurality of binary memory cells and the register, that selects a binary memory cell from the plurality of binary memory cells and inverts a state of the selected binary memory cell in response to each of a plurality of N counter update signals; and (D) a conversion table that converts the states of the plurality of binary memory cells to an index value;

wherein the controller increments the register once every N counter update signals and wherein the controller on average inverts each of the plurality of binary memory cells an equal number of times; and wherein the controller determines the counter value in accordance with the index value and a value in the register.

8. The apparatus of claim 7, wherein the controller identifies one of the plurality of binary memory cells as being inoperative, modifies the conversion table in response to the binary memory cell identified as being inoperative; and removes the binary memory cell identified as being inoperative from the plurality of binary memory cells that may selected in response to subsequent counter update signals.

9. The apparatus of claim 7, wherein the controller determines the counter value in accordance with the index value, the value in the register and an offset value.

10. An apparatus for updating and storing a counter value, comprising:

(A) a plurality of binary memory cells;

(B) a register that is different from the plurality of binary memory cells; and (C) a controller, coupled to the plurality of binary memory cells and the register, that selects a binary memory cell from the plurality of binary memory cells and inverts a state of the selected binary memory cell in response to each of a plurality of N counter update signals;

wherein the controller increments the register once every N counter update signals and wherein the controller on average inverts each of the plurality of binary memory cells an equal number of times; and wherein the register corresponds to a standard binary counter.

* * * * *